(12) United States Patent
Sullivan et al.

(10) Patent No.: US 7,274,413 B1
(45) Date of Patent: Sep. 25, 2007

(54) FLEXIBLE VIDEO DISPLAY APPARATUS AND METHOD

(75) Inventors: Patrick M. Sullivan, San Diego, CA (US); Stephen D. Russell, San Diego, CA (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 532 days.

(21) Appl. No.: 10/313,552

(22) Filed: Dec. 6, 2002

(51) Int. Cl.
*G02F 1/1345* (2006.01)

(52) U.S. Cl. .......................................... 349/43; 349/151
(58) Field of Classification Search ................ 349/151, 349/43, 44, 45
See application file for complete search history.

(56) References Cited

U.S. PATENT DOCUMENTS

| | | | |
|---|---|---|---|
| 5,574,292 A * | 11/1996 | Takahashi et al. ............. 257/59 |
| 5,659,379 A * | 8/1997 | Morimoto .................... 349/149 |
| 5,821,138 A * | 10/1998 | Yamazaki et al. ........... 438/166 |
| 5,856,856 A * | 1/1999 | Malhi ........................... 349/84 |
| 5,991,000 A | 11/1999 | Shimabukuro et al. |
| 6,011,291 A | 1/2000 | Russell et al. |
| 6,025,895 A * | 2/2000 | Yazaki et al. .................. 349/86 |
| 6,093,941 A | 7/2000 | Russell et al. |
| 6,122,091 A | 9/2000 | Russell et al. |
| 6,190,933 B1 | 2/2001 | Shimabukuro et al. |
| 6,204,902 B1 * | 3/2001 | Kim et al. ................... 349/112 |
| 6,312,968 B1 | 11/2001 | Shimabukuro et al. |
| 6,608,654 B2 * | 8/2003 | Zavracky et al. .............. 349/45 |
| 6,628,367 B2 * | 9/2003 | Hirabayashi et al. ........ 349/187 |
| 6,885,032 B2 * | 4/2005 | Forbes et al. .................. 257/72 |

* cited by examiner

*Primary Examiner*—David Nelms
*Assistant Examiner*—Richard H Kim
(74) *Attorney, Agent, or Firm*—Peter A. Lipovsky; J. Eric Anderson; Allan Y. Lee (57) ABSTRACT

A flexible video display apparatus and a method for making the same. The flexible video display comprises a silicon layer containing at least a portion of the control and display circuitry, a display layer, and a flexible layer. Other layers, such as an insulating layer for dielectric isolation of the semiconducting devices, may be added. To make the flexible video display, display and control circuitry are formed in a silicon-on-insulator wafer. A polymer layer is then formed on the wafer and electrically conductive portions are formed to interconnect the polymer portions to the control electronics, thereby forming the display. Next, a flexible layer is formed on the display layer and patterned if desired. A handle wafer is then bonded to the topside of the wafer so that the backside can be partially removed by mechanical, chemical, or chemical-mechanical means. Finally, the handle wafer is removed leaving the flexible display.

11 Claims, 10 Drawing Sheets

FLEXIBLE VIDEO DISPLAY APPARATUS AND METHOD

BACKGROUND OF THE INVENTION

This invention relates generally to the field of two-dimensional video displays and more particularly to a flexible video display with integrated control circuitry that is formed in a silicon-on-insulator wafer.

The video display technology industry is rapidly growing in an attempt to meet the demand for increased capability required for improved interfacing between computers and humans. Higher resolution, lower power, higher brightness, and lower cost displays are required to fit future needs. In addition, there is a growing requirement for a display technology that is compatible with non-planar surfaces.

The Department of the Navy is particularly interested in lightweight and flexible video displays as standard equipment for the "information warrior" of the future. Such flexible video displays may be affixed to curved surfaces for virtual reality or heads-up displays used in wearable computer systems or for highly portable display applications such as electronic maps that can be rolled up in a back pocket. Thus, there is a need for flexible video displays that may be unrolled into deployment or conformed to non-planar surfaces to meet the emerging applications for non-planar displays.

SUMMARY OF THE INVENTION

The invention is a flexible video display apparatus and a method for making the same. The flexible video display has a thin layer of silicon that contains at least a portion of the control circuitry and a portion of the display circuitry formed in the silicon layer using any useful available techniques in the art of microelectronic fabrication. The silicon layer is fixed to a flexible layer that forms a mechanical substructure for the flexible electronics. Additional layers or components may be added as desired to form a flexible video display. For example, an insulating layer may be disposed for the dielectric isolation of the semiconducting devices. A light-emitting or light-modulating polymer layer may be disposed to create an image display. Furthermore, the display layer may include sublayers such as, for example, contact electrodes, light-emitting materials such as organic polymers or electroluminescent porous silicon, liquid crystal materials with alignment layers, and color filters. In some applications, the flexible layer may be patterned to provide one or more regions to access the display function.

The method for forming a flexible video display apparatus provides for a video display that is flexible which enables conformal bonding of the video display to surfaces having a small radius of curvature. In one embodiment, a silicon-on-insulator (SOI) wafer is provided and the associated microelectronic fabrications are performed using techniques known to those skilled in the art of SOI fabrication to form the display and control circuitry and any associated circuitry desired. A light-emitting organic polymer layer is then formed and processed on the SOI wafer and electrically conductive portions are formed to interconnect the organic polymer portions to the control electronics, thereby forming the display. Next, a flexible polymer layer is formed on top of the aforementioned structure and patterned if desired. A handle wafer is then bonded to the topside of the wafer to provide a method to process the thinning of the assembly. The backside of the SOI wafer is at least partially removed by mechanical, chemical, or chemical-mechanical means. Finally, the handle wafer is removed leaving the flexible display.

BRIEF DESCRIPTION OF THE DRAWINGS

For a more complete understanding of the method of forming a flexible video display apparatus, reference is now made to the following detailed description of the embodiments as illustrated in the accompanying drawings, wherein.

DESCRIPTION OF THE EMBODIMENTS

Figure 1A:
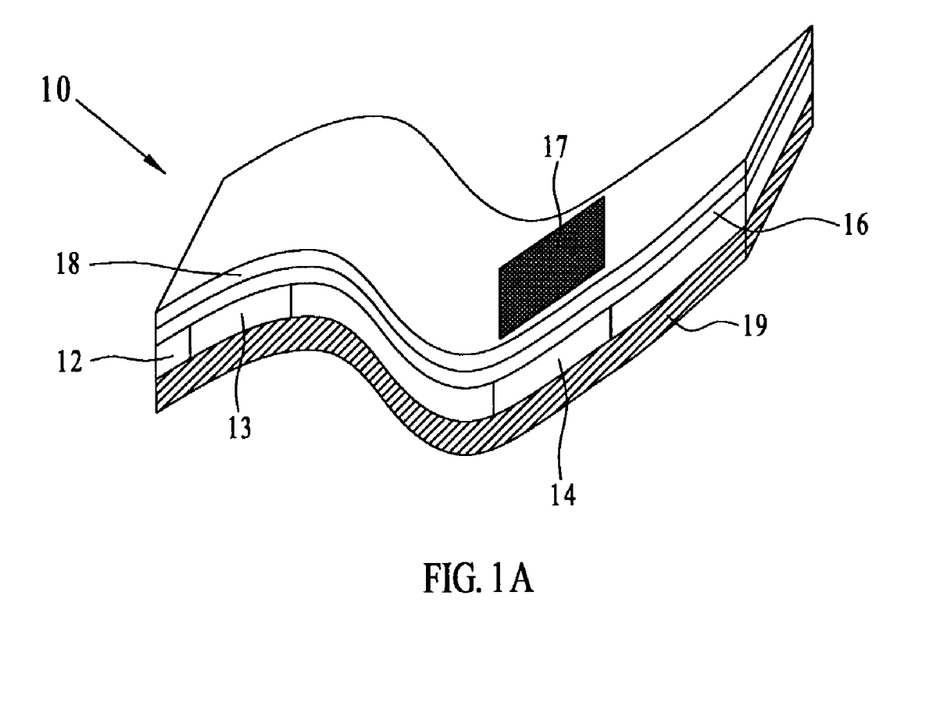
FIGS. 1A-1E are cross-sectional side views of embodiments of a flexible video display.

FIG. 1A shows a first embodiment of a flexible video display 10 which comprises a thin layer of silicon 12 which contains at least a portion of the control circuitry 13 and a portion of the display circuitry 14 formed in the silicon layer 12 using any useful available techniques in the art of microelectronic fabrication. Silicon layer 12 is mounted to a flexible layer 18 that forms a mechanical substructure for the flexible electronics. Additional layers or components may be added as desired to form the flexible video display. For example, insulating layer 19 may be disposed for the dielectric isolation of the semiconducting devices. Layer 16 may be a light-emitting or light-modulating polymer layer used to perform the display function. Furthermore, layer 16 may be composed of sublayers including, for example, contact electrodes, light-emitting materials such as organic polymers or electroluminescent porous silicon, liquid crystal materials with alignment layers, and color filters. In some applications, flexible layer 18 must be patterned to provide one or more regions 17 to access the display function.

Figure 1B:
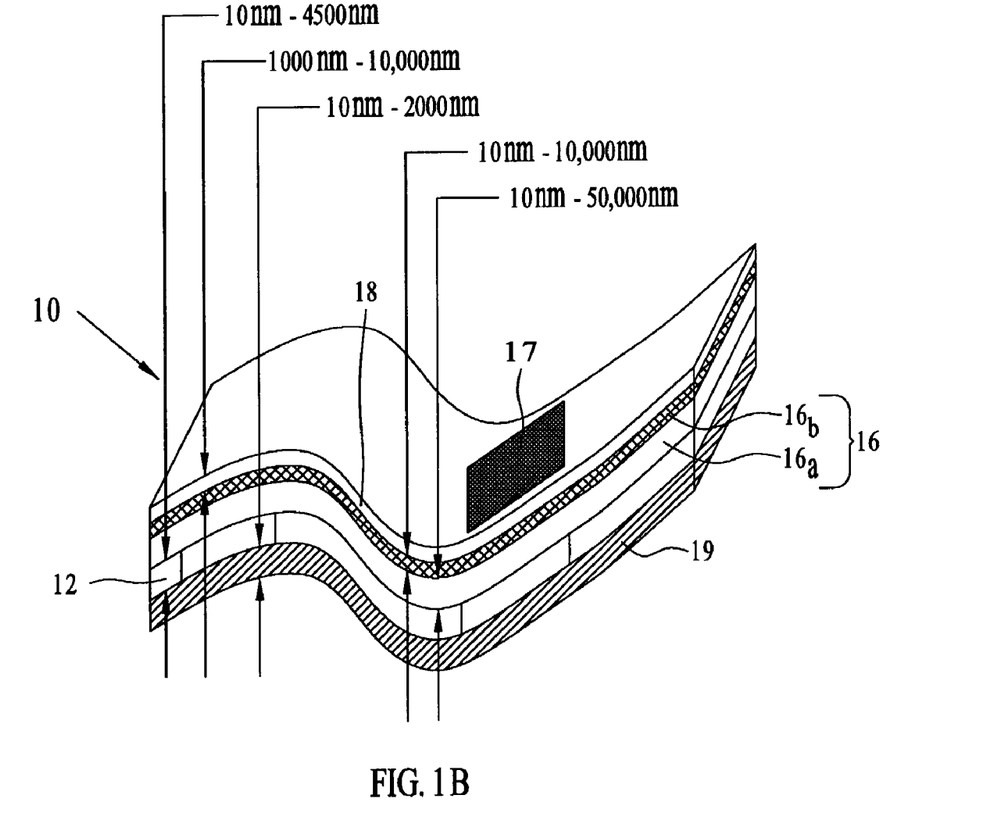

FIG. 1B shows an embodiment of a flexible video display 10 which comprises a single-crystal silicon film 12 having a thickness in the range of about 10 nm to about 4500 nm, formed on a silicon dioxide layer 19 having a thickness in the range of about 10 nm to about 2000 nm. Layer 16 comprises a layer of light-emitting organic polymer $16_a$ having a thickness in the range of about 10 nm to about 50000 nm and a conductive layer of indium tin oxide (ITO) $16_b$. The ITO is formed in the thickness range of about 10 nm to about 10000 nm and layer 16 is patterned to interconnect the display and control circuitry. Flexible layer 18 is formed from a polyimide having a thickness in the range of about 1000 nm to about 50000 nm and patterned to provide region 17 which allows the light from the organic polymer to be viewed or projected.

Figure 1C:
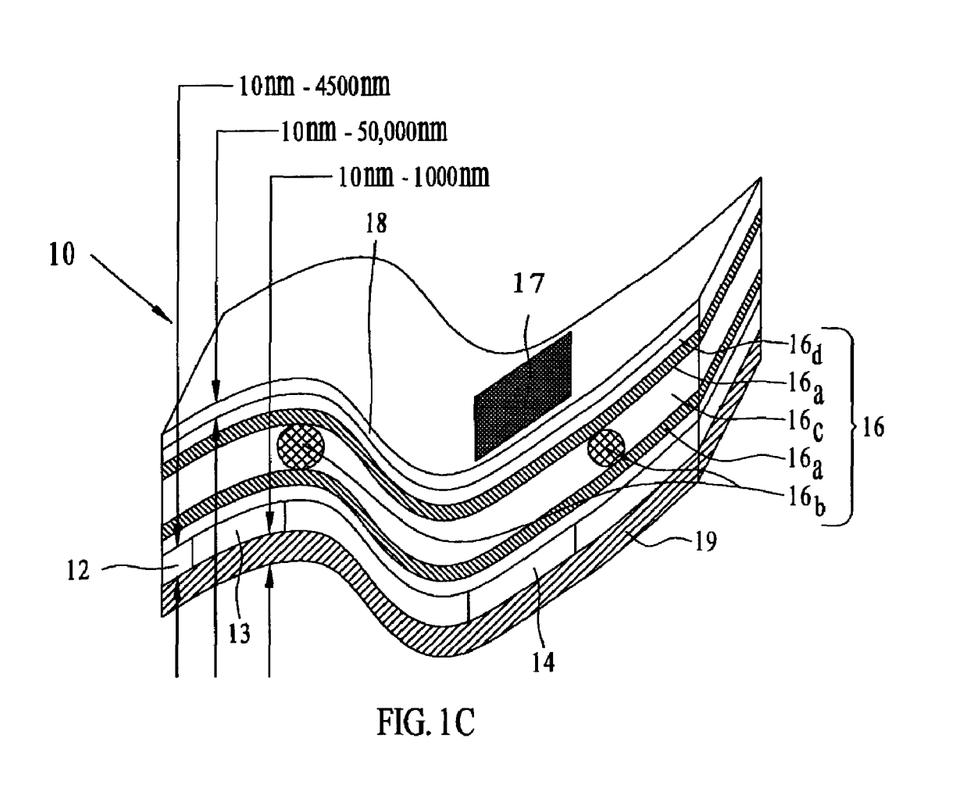

FIG. 1C shows another embodiment of a flexible video display 10 which comprises a single-crystal silicon film 12 having a thickness in the range of about 10 nm to about 4500 nm formed on a silicon dioxide layer 19 having a thickness in the range of about 10 nm to about 1000 nm. Layer 16 is a liquid crystal cell formed with polyimide alignment layers $16_a$, spacers $16_b$, liquid crystal material $16_c$, and a counter-electrode $16_d$, such as ITO formed on a flexible transparent layer, such as mylar. The ITO counter-electrode $16_d$ may be unpatterned, and the active-matrix or passive-matrix display addressed by interconnection to the control and display circuitry (13, 14) formed in the single-crystal layer 12. Flexible layer 18 is formed of a polyimide thickness in the range of about 10 nm to about 50000 nm and patterned to allow the light modulated by the liquid crystal to be viewed or projected through region 17.

Figure 1D:
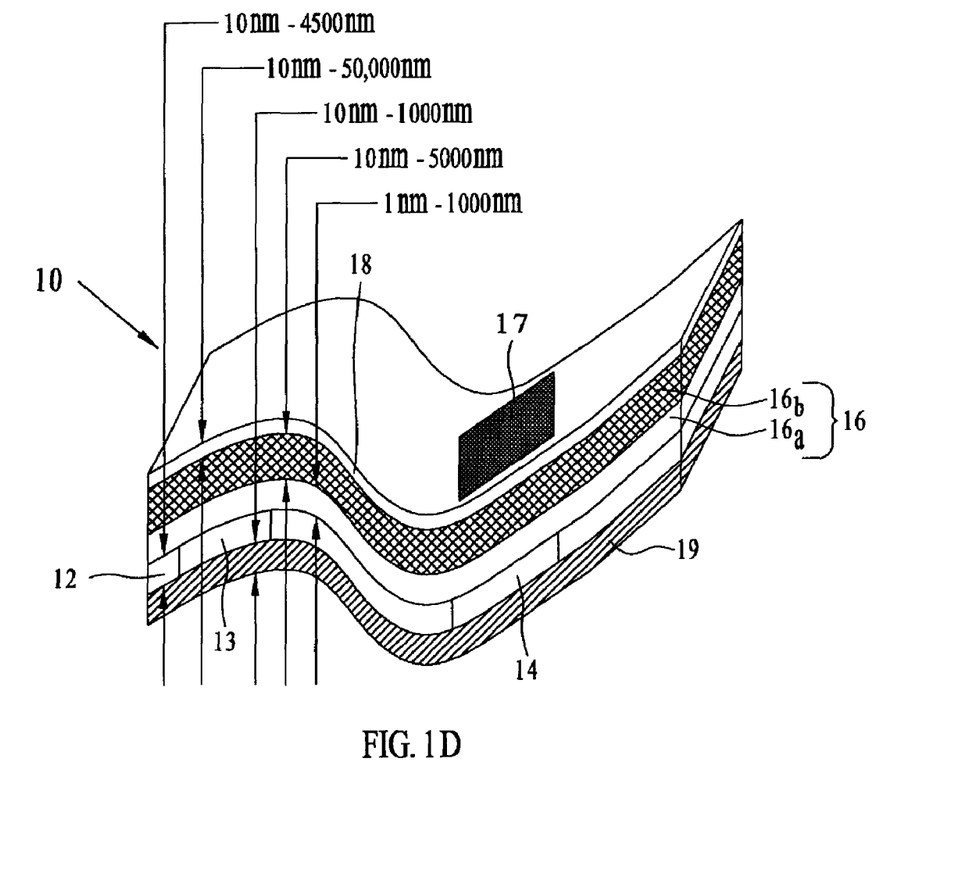

FIG. 1D shows another embodiment of a flexible video display 10 which comprises a single-crystal silicon film 12 having a thickness in the range of about 10 nm to about 4500 nm formed on a silicon dioxide layer 19 having a thickness in the range of about 10 nm to about 1000 nm. Layer 16 comprises an electroluminescent silicon structure $16_a$, such as porous silicon or nanocrystalline silicon, with thickness in the range of about 1 nm to about 1000 nm, and a conductive layer $16_b$ of ITO. The ITO is formed in the thickness range of about 10 nm to about 5000 nm and patterned to interconnect the control and display circuitry (13,14). Flexible layer 18 is formed by a polyimide in the thickness range of about 10 mm to about 50000 nm and patterned to form region 17 that allows light from the electroluminescent silicon structure to be viewed or projected.

Figure 1E:
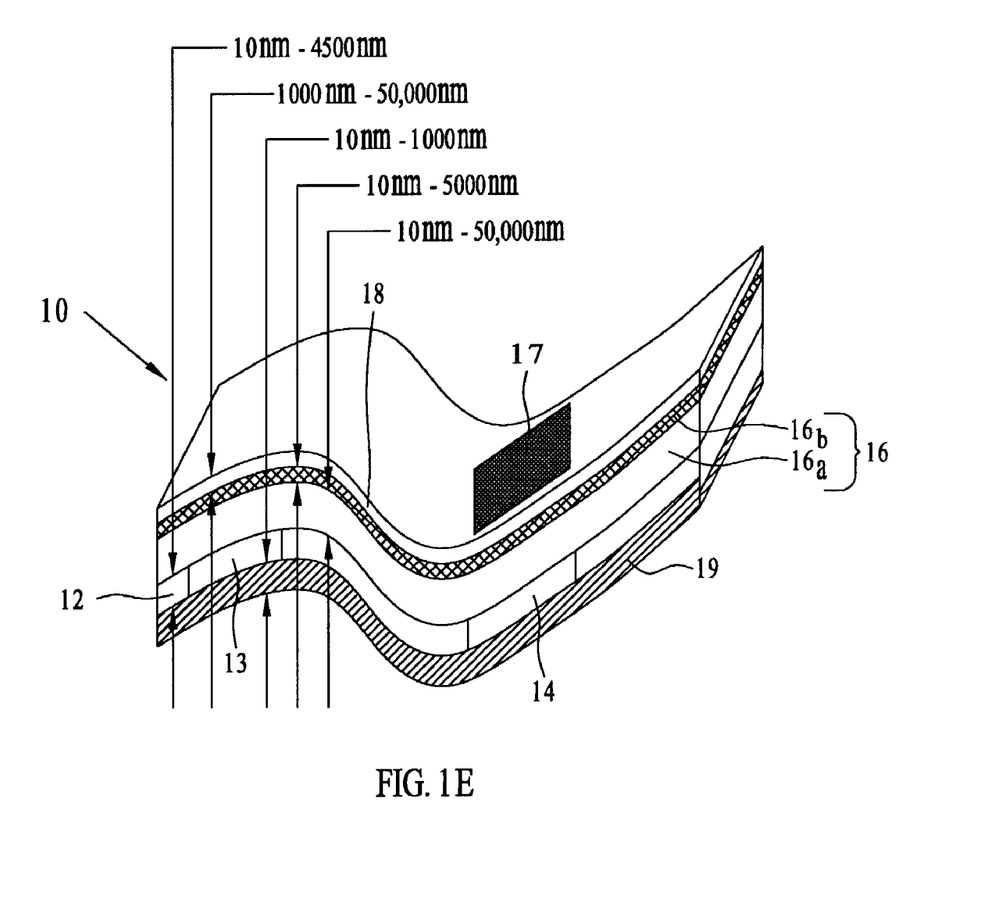

FIG. 1E shows another embodiment of a flexible video display 10 which comprises a polycrystalline or amorphous silicon film 12 having a thickness in the range of about 10 nm to about 4500 nm formed on an insulating layer 19 having a thickness in the range of about 10 nm to about 1000 nm. The insulating layer 19 may include a plurality of layers, such as doped-silicon dioxide on undoped-silicon dioxide, or silicon nitride on silicon dioxide, which provides dielectric isolation and acts as an etch stop in the fabrication process. Layer 16 is a light-emitting organic polymer $16_a$ having a thickness in the range of about 10 nm to 50000 nm and a conductive layer of ITO $16_b$. The ITO is formed in the thickness range of about 10 nm to about 5000 nm and layer 16 is patterned to interconnect the display and control circuitry (13, 14). Flexible layer 18 is formed from a polyimide having a thickness in the range of about 1000 nm to 50000 nm and patterned to form region 17 that allows light from the organic polymer to be viewed or projected.

Figure 2:
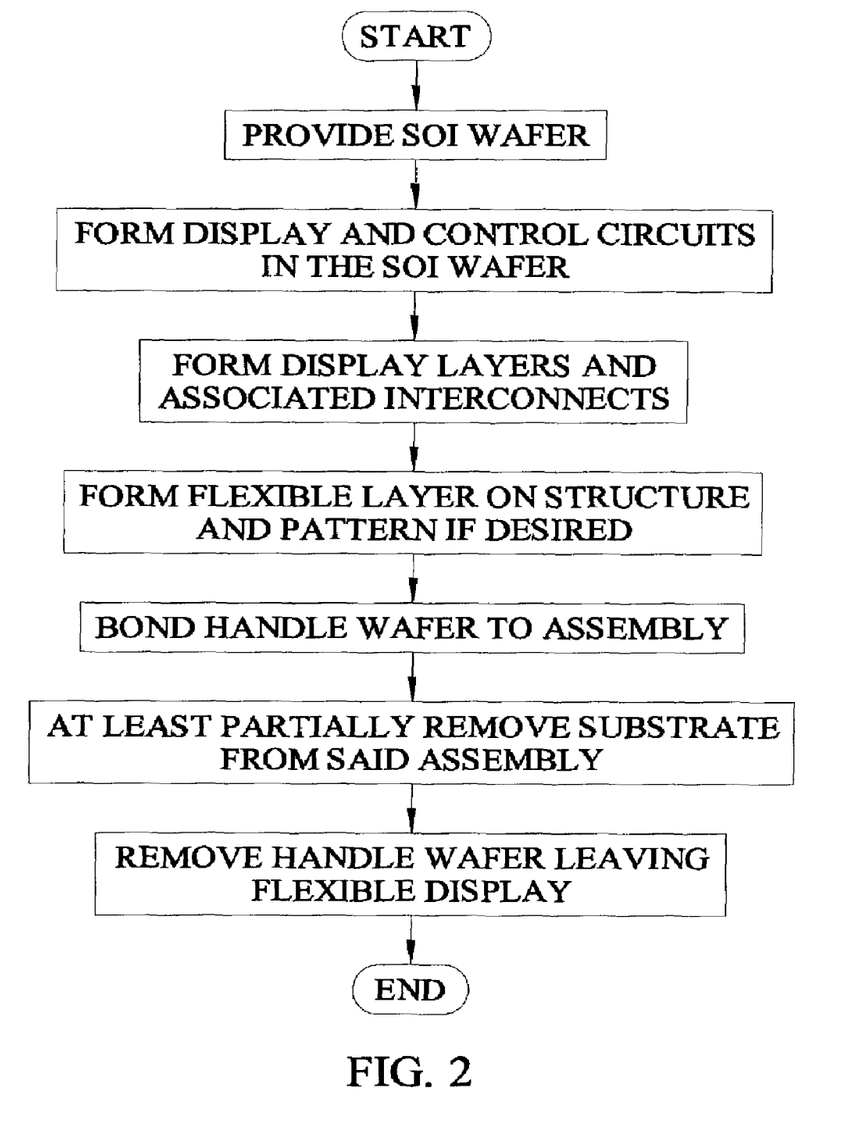
FIG. 2 is a flowchart of a method for forming a flexible video display using SOI wafer.

FIG. 2 illustrates a method for forming a flexible video display. In one embodiment, an SOI wafer is provided and the associated microelectronic fabrications are performed using techniques known to those skilled in the art of SOI fabrication to form the display and control circuitry and any associated circuitry desired. A light-emitting organic polymer layer is then formed and processed on the SOI wafer and electrically conductive portions are formed to interconnect the organic polymer portions to the control electronics, thereby forming the display. Next, a flexible polymer layer is formed on top of the aforementioned structure and patterned if desired. A handle wafer is then bonded to the topside of the wafer to provide a method to process the thinning of the assembly. The backside of the SOI wafer is at least partially removed by mechanical, chemical, or chemical-mechanical means. Finally, the handle wafer is removed to produce the flexible display.

The method for forming a flexible video display may also include affixing the flexible video display to non-planar surfaces or to additional structures to deploy or straighten the display as required.

Figure 3:
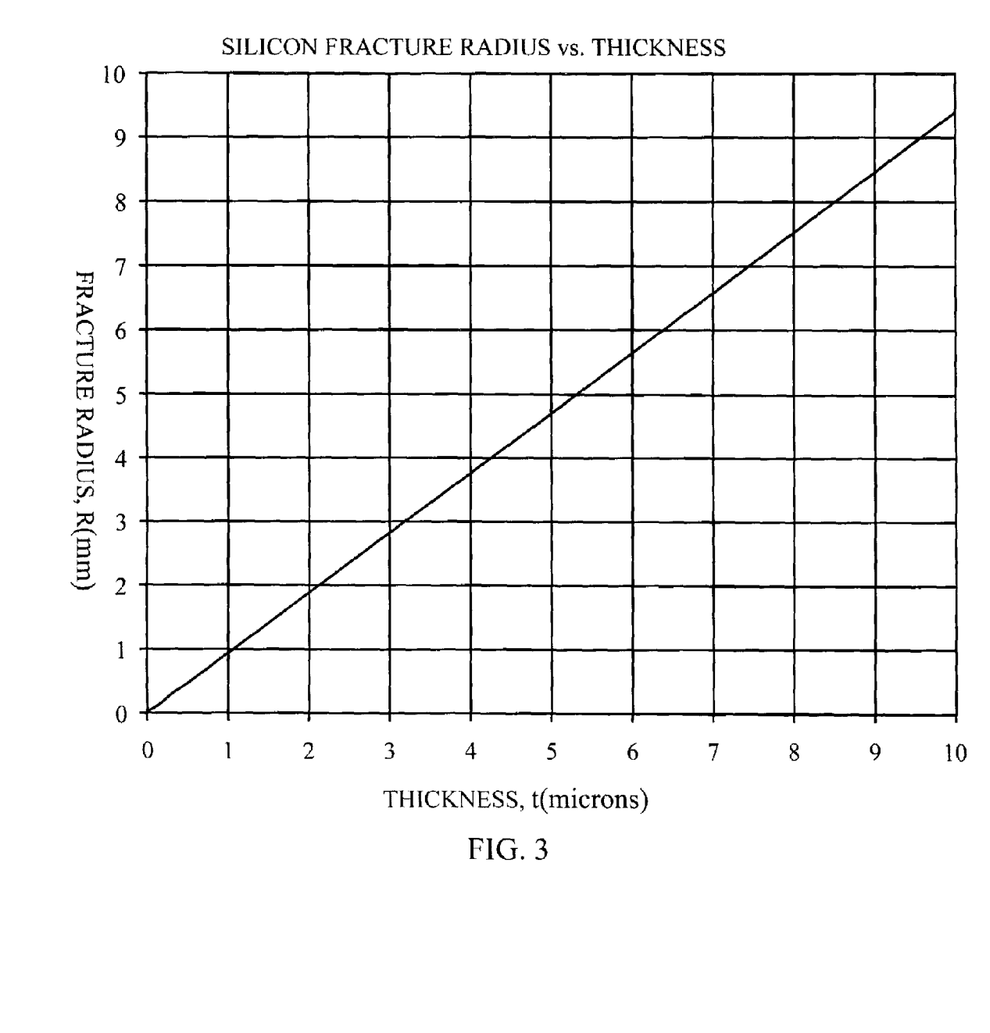
FIG. 3 is a graph of the calculated fracture radius of silicon versus its thickness.

The method for forming a flexible video display provides for a video display that is flexible which enables bonding of the video display to conformal surfaces with a small radius of curvature. To illustrate this point, consider the fracture radius of silicon which may be expressed as:

$$R(\text{mm})=(E*10)*t(\mu m)/(2*\text{Tensile strength})\approx 0.94*t(\mu m),$$

where E=Young's modulus=188 GPa and Tensile strength≈100 MPa.

As shown in FIG. 3, a direct relationship exists between the calculated fracture radius (R) of silicon and its thickness (t). The fracture radius of silicon decreases with its thickness. Circuits can be, and have been, rolled into cylinders of 1 to 2 millimeters in diameter.

Figure 4:
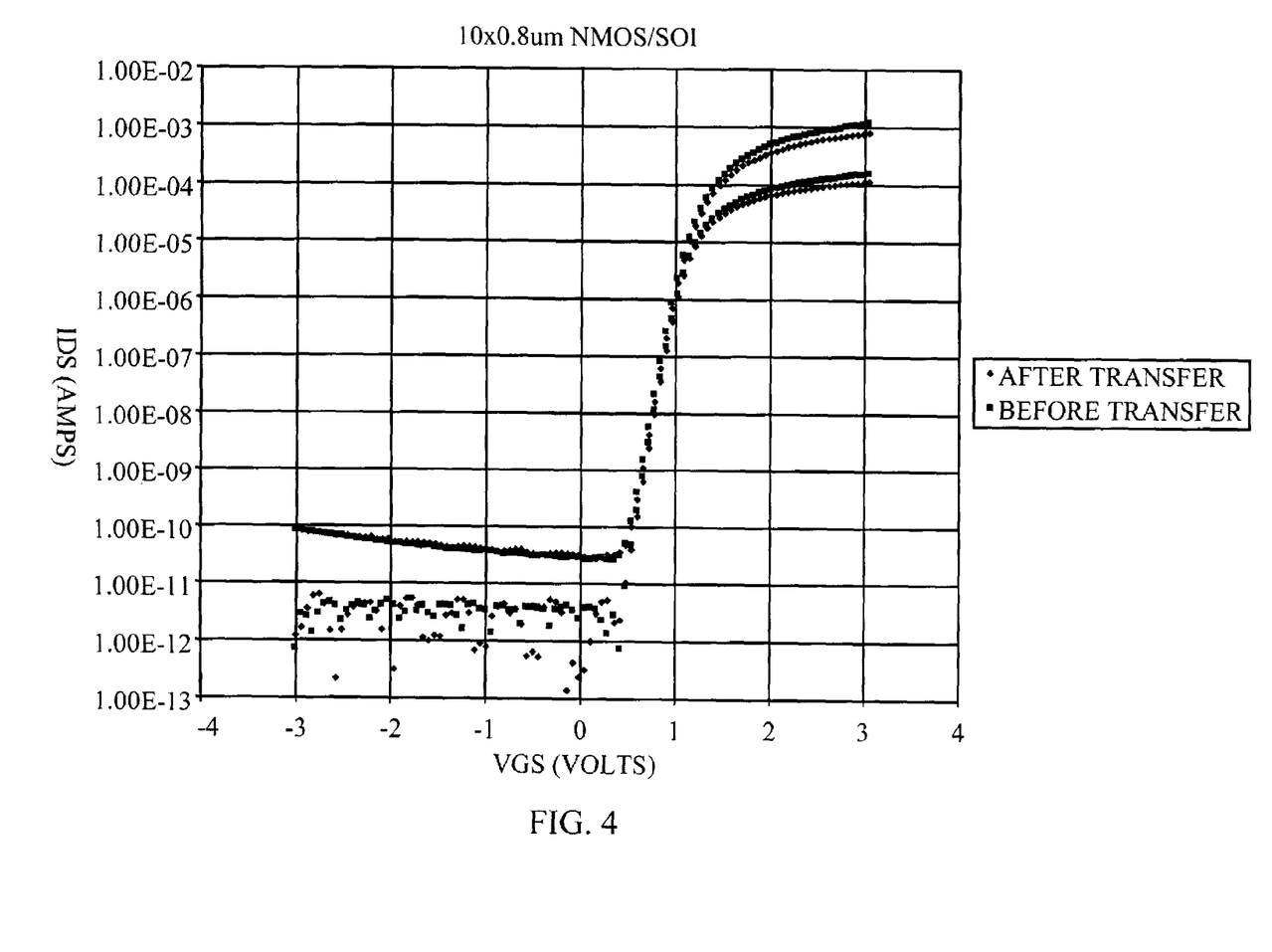
FIG. 4 is plot of threshold voltages for a 0.8 μm gate-length n-channel transistor (NMOS) before and after the transfer to plastic.
Figure 5:
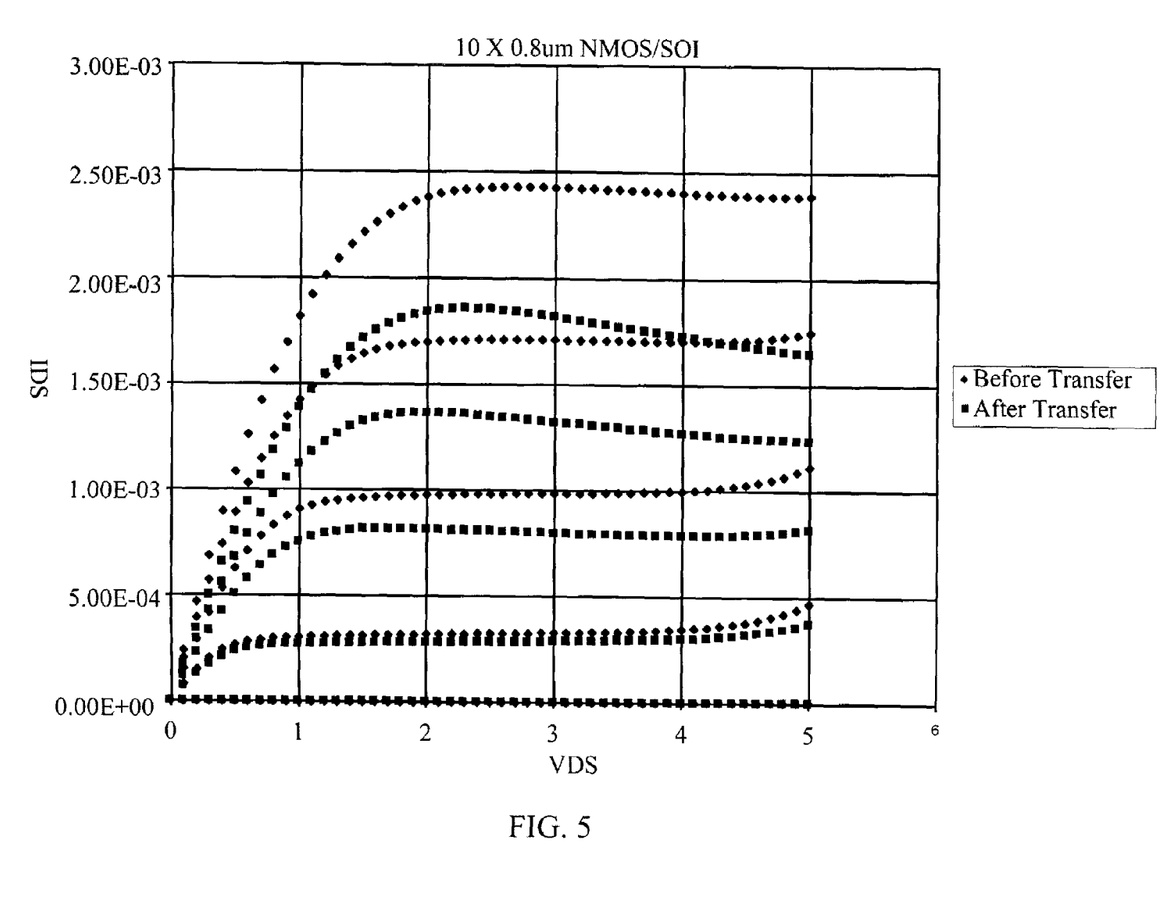
FIG. 5 shows changes in the current-voltage (I-V) characteristics from the silicon-on-plastic process; and (f)

Transferring silicon devices to plastic substrates and bending the resultant flexible devices over a radius of curvature affect electronic device properties. Device properties can change in silicon devices from the addition of strain (residual strain or strain induced by bending) and by device self-heating spreader. These devices under strain exhibit changes in mobility and energy levels. The mobility changes are due to changes in the effective masses of the charge carriers. The changes in energy levels show up as threshold voltage shifts in MOS devices. These changes have been modeled to ensure that circuits built from these devices can be simulated accurately before fabrication. FIG. 4 shows a plot of threshold voltages for a 0.8 µm gate-length n-channel transistor (NMOS) before and after the transfer to plastic. FIG. 5 shows changes in the current-voltage (I-V) characteristics from the silicon-on-plastic process. Note that this change is associated with self-heating and can be accommodated by proper circuit modeling as currently practiced in the SOI field.

Figure 6:
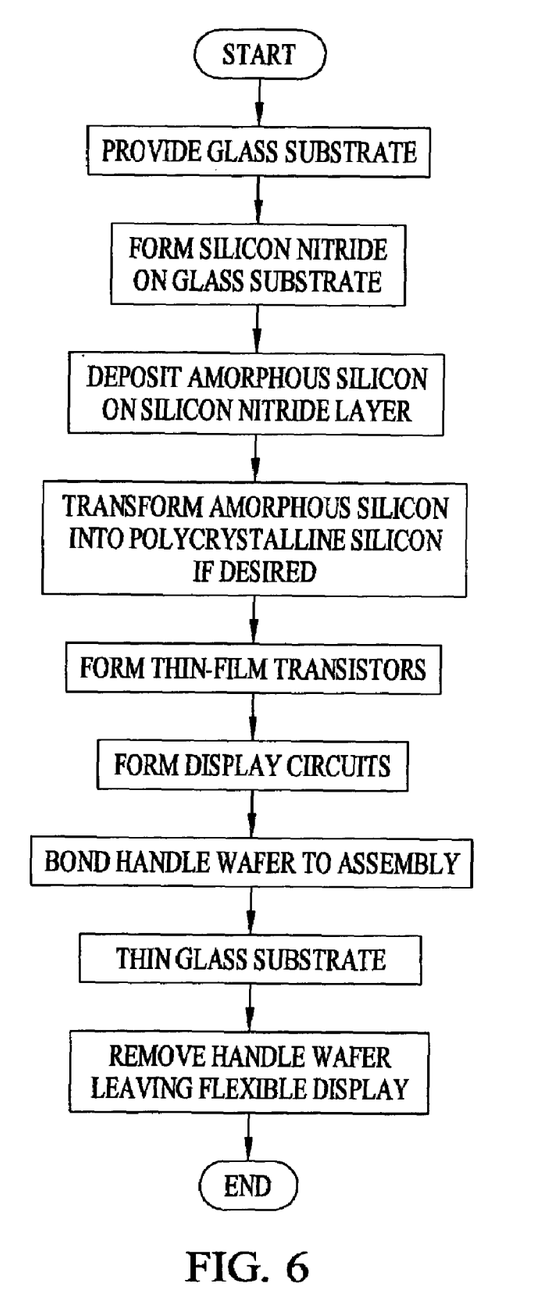
FIG. 6 is a flowchart of another method for forming a flexible video display using thin-film-transistors formed on glass.

As shown in FIG. 6, the method for forming a flexible video display may also be extended for thin-film-transistors formed on glass, using suitable thinning techniques for thinning glass. For example, a glass substrate may be provided with a silicon nitride layer of thickness of about 10 nm to about 2000 nm formed on the glass substrate. Amorphous silicon can then be deposited on the silicon nitride layer using techniques used in the fabrication of thin film transistors on glass. If desired, the amorphous silicon may be thermally treated by, for example, rapid thermal annealing, furnace annealing or excimer laser annealing, to transform the amorphous silicon into polycrystalline silicon as practiced in the art. Thin film transistors are then formed in conventional manner followed by the formation of the display components. As taught above, a handle wafer is bonded to the assembly of display and electronic components. The backside of the glass is then chemically-mechanically polished using a suitably dilute solution, such as hydrofluoric acid solution, which removes the glass substrate leaving the silicon nitride layer as the etch stop. In this case, the nitride layer acts as both an etch stop and the dielectric isolation for the electronic devices.

Another fabrication method example is to manufacture the driver circuitry for displays in single-crystal silicon, as described above, and affix to alternative flexible display technologies such as those fabricated in a reel-to-reel format. In such cases, low cost and lower performance displays, such as a passive matrix liquid crystal, may be used but the high performance flexible drivers may be affixed without loss of flexibility associated with other chip-on-flexible substrate concepts.

The method of forming a flexible video display apparatus is adaptable to the fabrication of both low-voltage, low power CMOS circuits and for circuitry requiring higher voltage operation, such as, for example, organic polymers and some liquid crystal materials. The method of forming a flexible video display apparatus is also adaptable to a variety of display technologies, both light-emitting and light-modulating displays. The light-emitting display may be embodied as, for example, electroluminescent semiconductors (porous and nanocrystalline silicon, silicon nanostructures, II-VI and III-V semiconductors and their alloys and composite structures) or organic polymers. The light-modulating display may be embodied as, for example, reflective or transmissive light valves, nematic liquid crystals, twisted-nematic liquid crystals, ferroelectric liquid crystals, electro-optic materials, or microelectromechanical systems (MEMS) structures. In the case of light modulating displays, flexible fiber optic membranes may be affixed to provide a flexible light source or the light source may be optically coupled, but not physically coupled to the flexible display. The flexible displays described herein may also be concatenated or tiled in a manner to produce larger display areas as required.

The described embodiments generally exemplify the products of the method of forming a flexible video display apparatus using an SOI wafer. Any variety of SOI wafer may be used including, without limitation, those formed by wafer bonding, plasma implantation, ion implantation, epitaxial deposition, and chemical vapor or physical vapor deposition. The method, as described, may also exploit the use of etch stops such as, for example, a silicon dioxide etch stop or a silicon nitride etch stop. Other useful etch stops may be employed, including those sensitive to dopant concentration, crystalline orientation, or crystalline defects, for example.

Other embodiments of the method of forming a flexible video display apparatus include, without limitation, the use of alternative bonding materials for the handle substrate, useful flexible materials other than polyimide, and useful display elements such as those used in the fabrication of field emission displays or MEMS displays.

Another embodiment of the method of forming a flexible video display apparatus is to make electrical contact from either the top surface or the bottom surface using suitably positioned vias. The display portions may also be added on top of the flexible layer if the resulting processing temperatures are restricted below about 350° C.

Yet another embodiment of the invention includes disposing additional sacrificial layers underneath, but not necessarily in contiguous contact, with the semiconductor layer. Rather than thinning the entire backside, such additional sacrificial layer may be removed to thereby separate the top assembly in contact with the handle layer from the bottom substrate.

Clearly, many modifications and variations of the method, of forming a flexible video display apparatus are possible in light of the above teachings. It is therefore to be understood that within the scope of the appended claims the method of forming a flexible video display apparatus may be practiced otherwise than as specifically described.

We claim:

1. A flexible video display comprising:
   an insulating layer;
   a single-crystal silicon layer on said insulating layer;
   control and display circuits disposed within said single-crystal silicon layer;
   a display layer operably coupled to said control and display circuits disposed within said single-crystal silicon layer; and
   a flexible polyimide layer on said display layer.

2. The flexible display of claim 1 wherein said single-crystal silicon layer has a thickness between about 10 nm to about 4500 nm.

3. The flexible display of claim 1 wherein said display layer includes light-modulating materials selected from the group consisting of nematic liquid crystals, twisted-nematic liquid crystals, ferroelectric liquid crystals, electro-optic materials, and microelectromechanical systems.

4. A method for fabricating a flexible video display comprising the steps of:
   fabricating display and control circuits in a single-crystal silicon layer of a silicon-on-insulator substrate;
   forming a display layer on said display and control circuits in said single-crystal silicon layer of said silicon-on-insulator substrate;
   operably coupling said display layer to said display and control circuits fabricated in said single-crystal silicon layer;
   forming a flexible polyimide layer on said display layer;
   bonding a handle wafer to said silicon-on-insulator substrate;
   thinning said silicon-on-insulator substrate; and
   removing said handle wafer to form a flexible display.

5. The method of claim 4 wherein said single-crystal silicon layer has a thickness between about 10 nm to about 4500 nm.

6. The method of claim 4 wherein said step of forming a display layer comprises the step of forming light-modulating devices selected from the group consisting of nematic liquid crystals, twisted-nematic liquid crystals, ferroelectric liquid crystals, electro-optic materials, and microelectromechanical systems.

7. The method of claim 4 wherein said step of forming a display layer comprises the step of forming light-emitting displays.

8. The method of claim 4 wherein said step of forming a display layer comprises the step of forming light-emitting devices consisting of organic polymers.

9. A flexible video display comprising:
   an insulating layer;
   a single-crystal silicon layer on said insulating layer;
   control and display circuits disposed within said single-crystal silicon layer;
   a light-emitting display layer operably coupled to said control and display circuits disposed within said single-crystal silicon layer; and
   a flexible polyimide layer on said light-emitting display layer.

10. The flexible display of claim 9 wherein said single-crystal silicon layer has a thickness between about 10 nm to about 4500 nm.

11. The flexible display of claim 9 wherein said light-emitting display layer comprises organic polymers.

* * * * *